US008670570B2

(12) United States Patent
Zong et al.

(10) Patent No.: US 8,670,570 B2

(45) Date of Patent: Mar. 11, 2014

(54) ENVIRONMENTAL EFFECTS GENERATOR FOR DIGITAL AUDIO SIGNALS

(75) Inventors: Wenbo Zong, Singapore (SG); Yuan Wu, Singapore (SG); Sapna George, Singapore (SG)

(73) Assignee: STMicroelectronics Asia Pacific PTE., Ltd., Singapore (SG)

( * ) Notice: Subject to any disclaimer, the term of this patent is extended or adjusted under 35 U.S.C. 154(b) by 1415 days.

(21) Appl. No.: 11/982,849

(22) Filed: Nov. 5, 2007

(65) Prior Publication Data

US 2008/0137875 A1 Jun. 12, 2008

Related U.S. Application Data

(60) Provisional application No. 60/857,308, filed on Nov. 7, 2006.

(51) Int. Cl.
*H03G 3/00* (2006.01)

(52) U.S. Cl.
USPC .................... 381/63; 381/61; 84/630; 700/94

(58) Field of Classification Search
USPC .............. 381/63, 61, 64, 65, 62; 84/630, 626, 84/601, 600, 629, 707; 700/94
See application file for complete search history.

(56) References Cited

U.S. PATENT DOCUMENTS

| | | | | |
|---|---|---|---|---|
| 4,268,717 | A | 5/1981 | Moore | |
| 4,535,474 | A | 8/1985 | Borish et al. | |
| 4,803,731 | A | 2/1989 | Niimi et al. | |
| 5,491,754 | A * | 2/1996 | Jot et al. | 381/63 |
| 6,188,769 | B1 * | 2/2001 | Jot et al. | 381/63 |
| 6,580,796 | B1 | 6/2003 | Kuroki | |
| 6,978,027 | B1 * | 12/2005 | Dahl et al. | 381/63 |
| 2002/0067836 | A1 * | 6/2002 | Paranjpe | 381/63 |
| 2006/0045283 | A1 | 3/2006 | Lin et al. | |
| 2006/0177074 | A1 * | 8/2006 | Ko | 381/63 |

OTHER PUBLICATIONS

Interactive 3D Audio Rendering Guidelines. Sep. 1999, MIDI Manufacturers Association, Los Angeles, CA. Revision 1.0a. Entire Document.*

European Search Report dated Apr. 2, 2008 in European Patent Application No. EP 07 25 4402.

* cited by examiner

*Primary Examiner* — Vivian Chin

*Assistant Examiner* — Con P Tran

(74) *Attorney, Agent, or Firm* — Munck Wilson Mandala, LLP

(57) ABSTRACT

An device and method of generating environmental reverberation effects for digital audio signals is presented. The device includes a reverberation controller. The reverberation controller pre-processes one or more predetermined characteristics of a first audio signal to produce a pre-processed signal and generates a plurality of delayed outputs from the pre-processed signal, each output having a predetermined delay. The reverberation controller also produces a plurality of reflection outputs from the plurality of delayed outputs and combines the plurality of reflection outputs to produce a second audio signal having a desired reverberation response.

23 Claims, 5 Drawing Sheets

ENVIRONMENTAL EFFECTS GENERATOR FOR DIGITAL AUDIO SIGNALS

CROSS-REFERENCE TO RELATED APPLICATION

This application claims priority under 35 USC §119(e) to U.S. provisional Application Ser. No. 60/857,308 filed on Nov. 7, 2006, and which is incorporated herein by reference.

TECHNICAL FIELD

The disclosure relates generally to audio signal processing, and in particular to generating environmental reverberation effects for digital audio content.

BACKGROUND

Artificial reverberations are often added to dry audio contents to simulate effects of real or virtual environments. In many applications such as headphone and speaker playbacks, artificial reverberations are added to give the listeners a sense of being in the real environments, such as a concert hall, an auditorium, etc. In nature, reverberations are echoes bounced back at different time instants from the surrounding environment, such as a room. The ideal way of generating reverberations would be convolving the audio signal with the impulse response of the desired environment. Such conventional methods are formulated by treating the environment as a linear time-invariant system whose characteristics are completely specified by its impulse response. However, such methods are difficult to implement. Firstly, it requires that the impulse response of the environment be accurately measured, digitized, and stored in a device. Secondly, such a measurement has to be conducted for each environment, which may be very costly in practice. Due to the long duration of the impulse response, in a digital signal processing application, it may take large computational and storage resources to convolve an impulse response with an input signal.

A number of conventional methods have been proposed to approximate the exact reverberation response or to create only the salient signals. Some of the algorithms use feedback loops with delay lines, sometimes combined with all-pass filters. One drawback of such feedback systems is that they typically create resonances that colorize the sound. Such problems are overcome by phase-shifting or time-variant delay lines in some algorithms, which may introduce certain undesired pitch shifting effects. Some algorithms use only delay lines and feed forward loops, tapping at different locations of the delay lines. Some other conventional algorithms separate the reverberation into early and late parts and generate them separately. This typically leads to a sudden increase of echo density at the boundary, which is not true in a natural environment. Attempts based on modeling techniques have also been reported in the literature.

SUMMARY

Embodiments of the present disclosure solve the problem of generating environmental reverberation effects controlled by parameters describing the characteristics of the environment's reverberation response. The reverberations generated sound natural with little coloration and give the sense of spaciousness of the desired environment. In addition, the method is easily controlled to simulate different environments. Moreover, the present disclosure provides a method of generating reverberations using a uniform structure to generate reverberations controlled by a plurality of descriptive characteristics (parameters) either extracted from real environments or completely specified as wish.

In one embodiment, a device includes a reverberation controller. The reverberation controller pre-processes one or more predetermined characteristics of a first audio signal to produce a pre-processed signal and generates a plurality of delayed outputs from the pre-processed signal, each output having a predetermined delay. The reverberation controller also produces a plurality of reflection outputs from the plurality of delayed outputs and combines the plurality of reflection outputs to produce a second audio signal having a desired reverberation response.

In another embodiment, a method of adding a desired reverberation response to an audio signal includes pre-processing one or more selected characteristics of a first audio signal to produce a pre-processed signal and generating a plurality of delayed outputs from the pre-processed signal, each output having a predetermined delay. The method further includes producing a plurality of reflection outputs from the plurality of delayed outputs and combining the plurality of reflection outputs to produce a second audio signal having a desired reverberation response.

In a further embodiment, a system includes an audio source, an audio output, a control unit, and a reverberation generator. The control unit can receive information from a user, the information relating to a desired reverberation response. The reverberation generator is coupled to the audio input, the audio output, and the controlling unit and includes a reverberation controller. The reverberation controller pre-processes one or more predetermined characteristics of a first audio signal from the audio source to produce a pre-processed signal and generates a plurality of delayed outputs from the pre-processed signal, each output having a predetermined delay. The reverberation controller also produces a plurality of reflection outputs from the plurality of delayed outputs and combines the plurality of reflection outputs to produce a second audio signal to the audio output, the second audio signal having the desired reverberation response.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
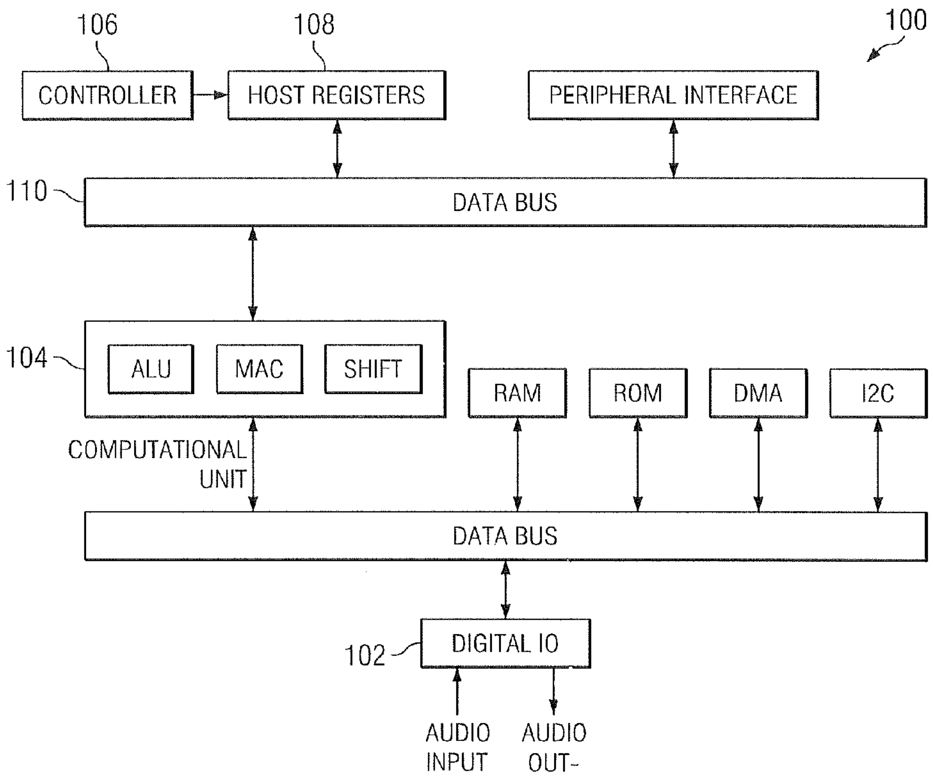
FIG. 1 illustrates a typical structure of a digital audio signal processor.

Many modern reverberation controllers use digital signal processing (DSP) with digital signal processors, which have limited computational and memory resources. A typical structure of a digital signal processor 100, especially for audio signals, is shown in FIG. 1. The audio data is input and output using a digital I/O interface 102. A computational unit 104 loads input audio data and program data to its own registers, processes the stored audio data, and sends the processed audio data back to the I/O interface for output.

Computation typically consists of additions, subtractions, multiplications and other operations. Multiplications typically needs more resources than other operations. Typically, short filter lengths and fewer multiplications will reduce the processing load of the processor. A controller 106 is typically present to control the processor through host registers 108 which are interfaced with the computational unit 104 through a data bus 110.

Figure 2:
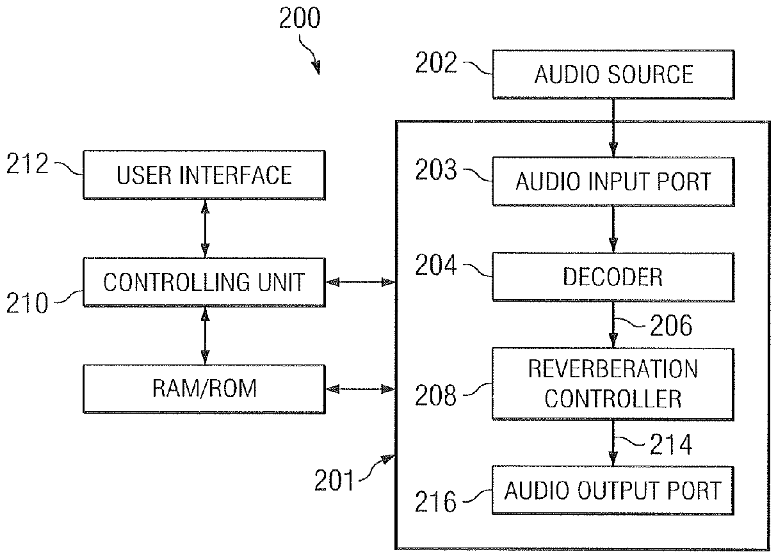
FIG. 2 is an exemplary application of the reverberation generator in a digital audio processor.

An example of a system or device 200 having a reverberation generator 201 is shown in FIG. 2. Audio content received at an audio input port 203 from an audio source 202 is first decoded by a decoder 204 to produce an uncompressed stream 206, in some embodiments in pulse code modulation (PCM) format. It will be understood that the audio source 202 may be a radio receiver, a microphone, or other source of a live audio signal; an optical, electronic or magnetic storage medium or other source of a stored audio signal; or any other source of an audio signal. The stream 206 is passed to a reverberation generator 208 as input. The reverberation controller 208 generates reverberations as specified by a controlling unit 210 that may in turn take in the information relating to a desired reverberation response via a user interface 212, producing a reverberated output 214 that is passed to an output port 216 or a further processing unit.

Figure 3:
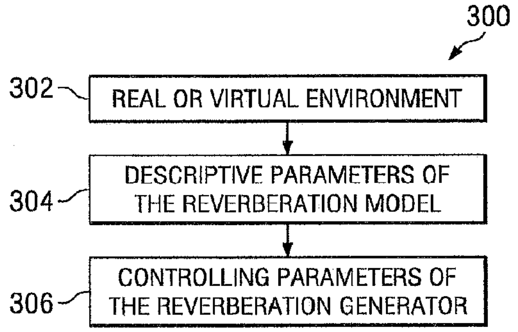
FIG. 3 illustrates a flow of information mapping from environment to the reverberation generator.

A flow of information mapping 300 is depicted in FIG. 3. To simulate reverberations without using the exact reverberation response of the environment, a reverberation model representing a desired reverberation response is established by extracting certain important descriptive characteristics (parameters) 304 of the reverberations from a desired environment 302. Extracted parameters are passed to the reverberation generator or controller to configure its internal controlling parameters 306 to generate the desired reverberation response. How to extract the descriptive parameters from the environment to map into the reverberation model is beyond the scope of this disclosure.

Figure 4:
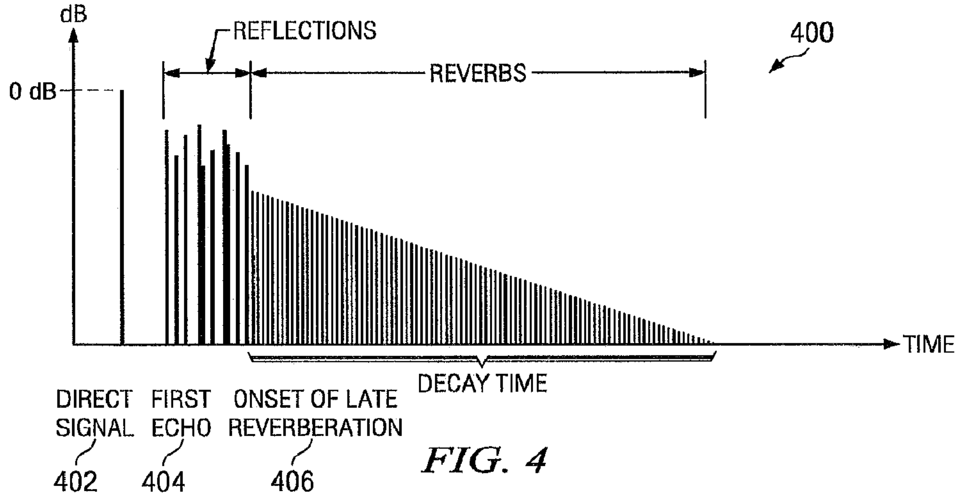
FIG. 4 shows a typical amplitude response of a real environment.

FIG. 4 shows an amplitude response 400 of a typical environment. The reverberation response model 400 comprises three temporal components: a direct signal 402, early reflections 404, and late reverbs 406. The direct signal 402 reaches the listener's ears first and is followed by the echoes 404 caused by reflections bounced back from the surroundings, for example, walls, doors. The reverberation generally shows certain characteristics: the early echoes 404 are quite sparse after the direct sound; the density of the echoes increases over time and in the late part of the reverberation 406, the echoes become so highly diffused and dense that they sound like random noise. How fast the density of the echoes is built up generally depends on the room size. The smaller a room is, the faster the density of the echoes will be built up. The rate of decay of the overall energy level of the echoes also varies depending on the absorption of the surfaces of the room.

Another factor is that the reflection surfaces generally absorb more high-frequency signals than low-frequency signals. As a result, high-frequency signals decay faster than low-frequency signals. How fast high frequency signals decay with respect to low-frequency signals depends on the surfaces of reflections. However, this is not necessarily the case when virtual environments are being simulated. In such applications as computer games, it may be so designed that low frequencies are being absorbed faster than high frequencies are. Hence the decay time may be frequency-dependent.

Note that the reverberation response in this model in fact describes the response at the listener's position for a particular position of the source, assuming that both are in the same environment. Hence, in general, not only does the reverberation response depend on the environment, but also depends on the absolute positions of both listener and source.

Given the observations and considerations above, a desired reverberation response may be characterized by, for example, the following set of parameters: (1) Intensity or a power of the whole response; (2) High Frequency (HF) Intensity Ratio or an attenuation at a reference high frequency (Reference HF) relative to DC; (3) Reflection Intensity or a power of early reflections; (4) Reverb Intensity or a power of late reverbs; (5) Reflection Delay or a delay time of a first reflection relative to a direct signal; (6) Reverb Delay or a delay time of an onset of late reverberation relative to a first reflection; (7) Decay Time or a reverberation decay time at low frequencies; (8) Decay Time HF Ratio or a ratio of decay time at high frequencies relative to decay time at low frequencies; (9) Diffusion Factor or an echo density of late reverberations; (10) Modal Density Factor or a modal density of late reverberations; and (11) Reference HF or a reference high frequency.

The method proposed in the present disclosure generates reverberations controlled by parameters as these, which offer increased flexibility in creating real or virtual environments. A computational cost of implementing an embodiment of the present disclosure using digital signal processing may be reasonably low due to factors such as: (1) a design involving few multiplications; (2) delay lines realized by circular buffers; and (3) filters implemented as first order IIR filters.

Figure 5:
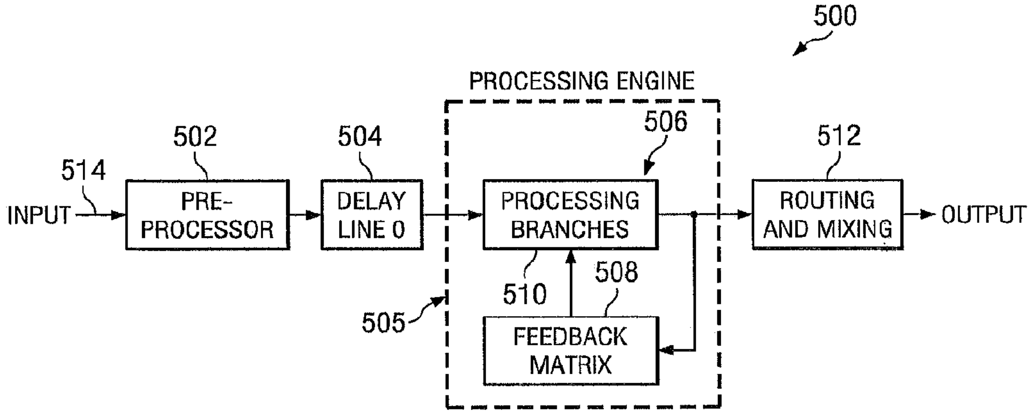
FIG. 5 shows a high-level functional block diagram according to one embodiment of the present disclosure.

A high-level functional block diagram of a reverberation controller 500 embodying the present disclosure is shown in FIG. 5. Each block is separately detailed in FIG. 6 to FIG. 11. Typically one or more modules are affected by each descriptive parameter of the reverberation model, and together the modules generate a reverberation response that matches a desired environment.

A pre-processor 502 prepares an input signal 514 and passes it to a tapped delay line (DL0) 504, which has N unevenly spaced reading taps. A processing engine module 505 takes the form of a feedback delay network (FDN) 506 that consists of a feedback matrix 508 and a bank of processing branches 510. The signals read from DL0 504 are summed with the feedback signals from the end of FDN 506 before entering the processing branches 510. The processing branches 510 all-pass filter, low-/high-pass filter, delay and attenuate their respective inputs, and then the processed signals are multiplied with the feedback matrix 508 to feed back to the beginning of the FDN 506. Reflections and reverbs are gathered from within the processing branches 510 and routed to respective routing and mixing modules 512.

To decorrelate reflections and reverbs within a channel as well as across channels, reverbs may be differentially delayed before mixing. The final output is formed by summing up the mixed reflections and the mixed reverbs. Having gone through many stages of filtering, delay and feedback, the reverberation is very natural sounding with little coloration. Since each stage only requires very simple operations such as low-order filtering, the total computational complexity is quite low. The memory required for a reasonably large range of each parameter is also quite minimal, as will be detailed in the next section.

In a preferred embodiment of the present disclosure, a reverberation controller can be configured by a set of descriptive parameters as described above. Such a reverberation controller may have one or two input channels, and may produce two outputs. Typically one descriptive parameter may affect one or more modules of the proposed method.

The Pre-Processor Module

Figure 6:
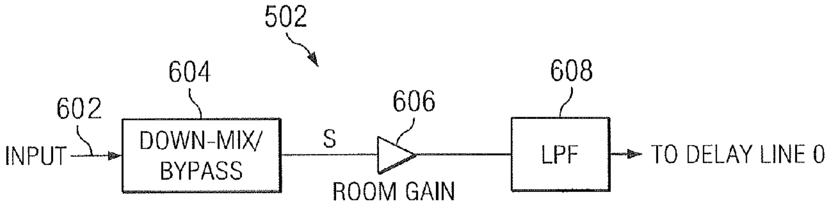
FIG. 6 is a schematic diagram illustrating a pre-processor according to one embodiment of the present disclosure.

A pre-processor module 502 is depicted in FIG. 6. When an input 602 is stereo, a down-mix/bypass module 604 may work in a down-mix mode, combining the two input channels to produce a single stream, denoted as S. When the input 602 is mono, the down-mix/bypass module 604 may be bypassed such that S is identical to input. S is then multiplied with Room Gain 606, which may be determined by Intensity, to control the overall intensity level of the reverberation. S is then passed through a Low-pass Filter (LPF) 608 to attenuate the intensity at the reference high frequency. The LPF is determined by HF Intensity Ratio and Reference HF, and typically it may be as simple a filter as a 1st order IIR filter. Since both multiplying by a gain and filtering are linear operations, the exact order of them does not matter. That is, the output is theoretically the same if LPF comes before the gain.

Tapped Delay Line 0 (DL0)

Figure 7:
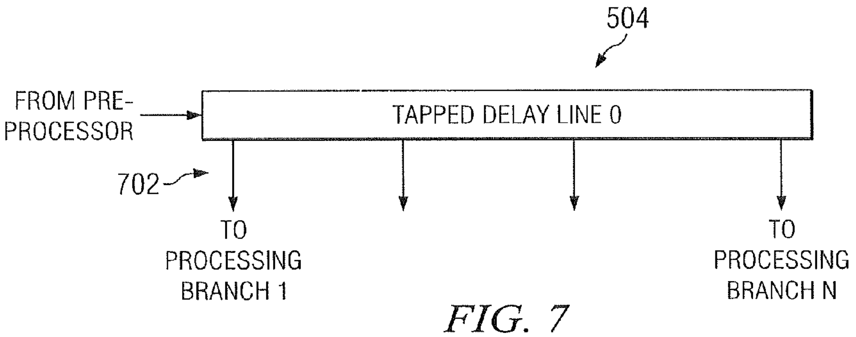
FIG. 7 is a schematic diagram showing a structure of a tapped delay line 0 according to one embodiment of the present disclosure.

The pre-processed stream S is fed into a tapped delay line (DL0) 504 one embodiment of which is depicted in FIG. 7. DL0 504 has N unevenly spaced reading taps 702, where N is the number of processing branches 510 of the processing engine module 505. Feeding the processing engine module 505 with unevenly spaced taps may increase the echo density while minimizing coloration. The offset of the first (earliest) tap may be determined by the value of Reflection Delay, which may be up to 0.3 seconds, and the spacing between successive reading taps is uneven and may change proportionally to the value of Reverb Delay. Furthermore, the distance between the last (latest) reading tap and the first reading tap is preferably in the range of 0.002 seconds to 0.025 seconds, where the lower bound of 0.002 seconds corresponds to extremely short Reverb Delay and the upper bound of 0.025 seconds to extremely long Reverb Delay.

The Processing Engine Module

Figure 8:
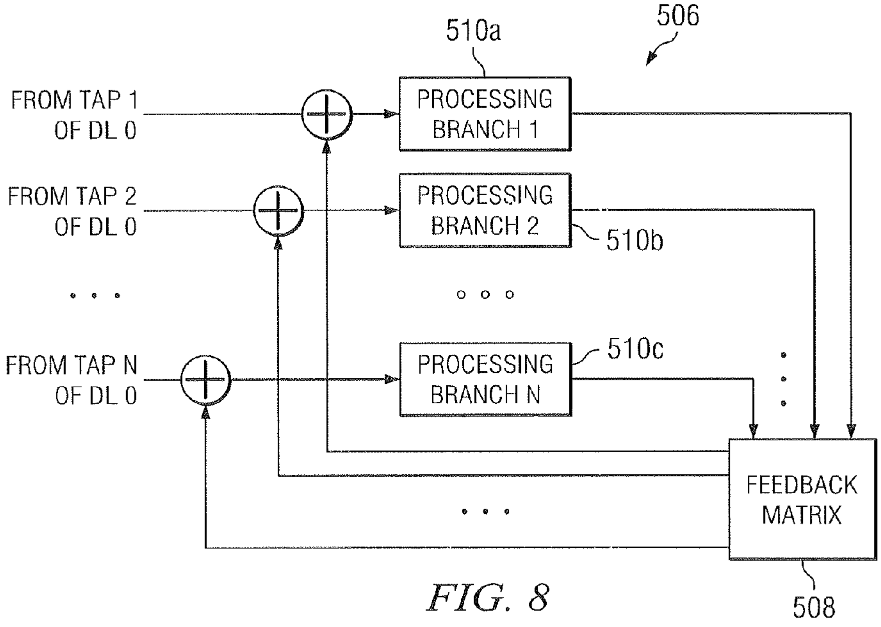
FIG. 8 is a schematic block diagram illustrating a processing engine module according to the present disclosure.
Figure 9:
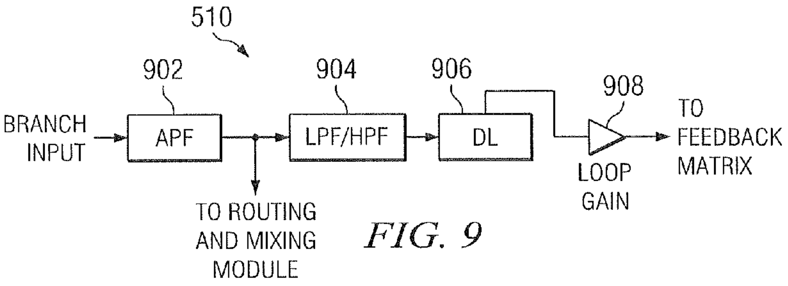
FIG. 9 is a schematic block diagram illustrating a processing branch according to an embodiment of the present disclosure.

An embodiment for the processing engine module 505 can be realized by a Feedback Delay Network (FDN) 506, as depicted in FIG. 8. FDN 506 consists of the N processing branches 510 and the feedback matrix 508. An exemplary processing branch 510*a* may be made up of an All-pass Filter (APF) 902, a Low-pass or High-pass Filter (LPF or HPF) 904, a delay line 906 and a gain 908, as depicted in FIG. 9. In FIG. 8, an input to processing branch 510*i*, where, 1<=i<=N, is the sum of an input read from reading tap i of DL0 504 and the ith element of the vector obtained by multiplying the feedback matrix 508 with delayed signals from the end of the processing branches 510.

Figure 10:
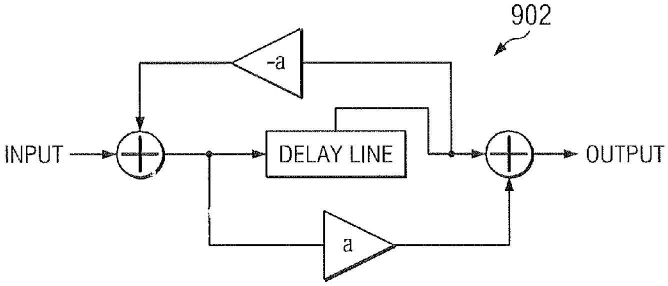
FIG. 10 is a block diagram illustrating the structure of an all-pass filter used in FIG. 9 according to one embodiment of the present disclosure.

Returning to FIG. 9, the APF 902 has a smoothly decaying impulse response and a flat frequency spectrum that introduces little coloration. An embodiment of the APF 902 is depicted in FIG. 10. The offsets of the reading taps to the delay lines in the APFs APF1-APFN may be proportional to the value of Reverb Delay, may be unevenly distributed, and may be chosen to be prime numbers. The shortest offset of the reading taps to the delay lines in the APFs APF1-APFN (i.e., the effective delay) is preferably in the range of 0.008 seconds to 0.02 seconds, where the lower bound of 0.008 seconds corresponds to extremely short Reverb Delay and the upper bound of 0.02 seconds to extremely long Reverb Delay. Furthermore, in case of N=4, the largest offset is preferably in the range of 1.2 to 1.5 times the shortest offset. The decay factors a of the APFs may be proportional to Decay Time and may also be unevenly distributed. In general, the longer the reading tap is, the smaller the decay factor a should be. A preferred range of a is recommended to be between 0.35 and 0.75. When implemented in a finite-precision representation based on quantization, an APF may produce an infinite low level output even after input is removed, known as zero-input limit cycles. This may be eliminated by truncating the magnitude of stored values toward zero.

The LPF/HPF 904 in the processing branch 510*a* may be used to control the Decay Time in a frequency-dependent manner. When Decay Time HF Ratio is less than 1, the LPF 904 may be used to make shorter the decay time at high frequencies, and the smaller Decay Time HR Ratio is, the greater the low-pass filtering effect HPF should be. On the other hand, when Decay Time HF Ratio is greater than 1, the HPF 904 may be used to make the decay time longer at high frequencies, and the greater Decay Time HR Ratio is, the greater the high-pass filtering effect HPF should be. When Decay Time HF Ratio is equal to 1 the LPF/HPF 904 effectively degrades to a unit gain. Reference HF may be used in the design of the LPF/HPFs, which may be as simple as 1st order IIR filters.

The delay lines 906 (DL1~DLN) in individual processing branches 510 of the FDN 506 may control the modal density of the generated reverbs and the pace of reverbs' building up. The longer the delay lengths are, the higher the modal density is, but the slower the building up of reverbs. The offsets of the reading taps to the delay lines (effective delay lengths) hence may be determined by Modal Density Factor and Reverb Delay jointly, may be unevenly distributed, and may be chosen be to prime numbers. At full capacity of Modal Density Factor, the smallest offset is preferably at least 45 milliseconds and not more than 100 milliseconds. Furthermore, for any Modal Density Factor the largest offset preferably does not exceed twice the length of the smallest. To further eliminate temporal structures in the late reverberation, the reading taps may be randomized within a certain range centered at a chosen location. Before they are fed into the feedback matrix, the outputs of the DL's 906 (DL1~DLN) are multiplied by respective gains 908 to achieve a desired Decay Time.

These gains 908 may be affected by the effective delay lengths of the DL's 906 (DL1~DLN). The feedback matrix (FM) 508 may be a unitary matrix and controls the echo density of the late reverberation. In general, the FM 508 may become sparser as Diffusion Factor becomes smaller. In one extreme, all elements of the FM 508 are non-zero values when the highest Diffusion Factor is desired; in the other extreme, the FM 508 becomes a diagonal matrix to cut off many feedback paths in response to a very low Diffusion Factor.

The matrixed signals are combined with the signals 702 read from respective taps of DL0 and then fed into the beginning of the processing branches 510.

The Routing and Mixing Module

Figure 11:
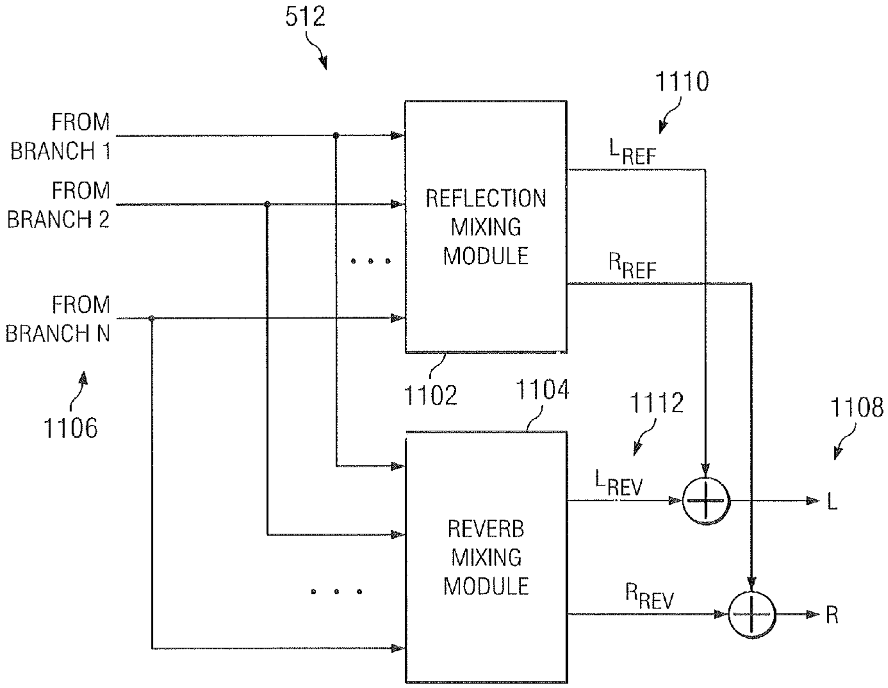
FIG. 11 is a schematic block diagram illustrating one embodiment of a routing and mixing module according to the present disclosure.
Figure 12:
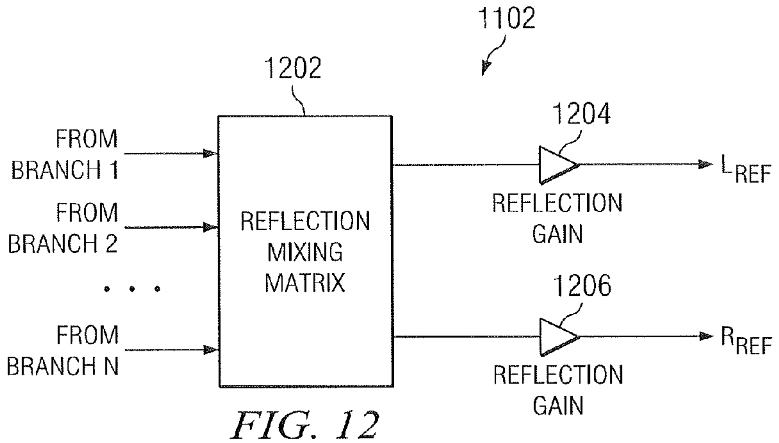
FIG. 12 is a schematic block diagram illustrating a reflection mixing module according to one embodiment of the present disclosure.

In the embodiment of the routing and mixing module 512 depicted in FIG. 11, inputs 1106 are collected from the taps after the APFs 902 in the FDN 506 as illustrated in FIG. 9. A reflection mixing module 1102 and a reverb mixing module 1104 may produce reflections 1110 and reverbs 1112 respectively, and final outputs 1108 of the reverberation controller are obtained by summing up the reflections 1110 and reverbs 1112 on respective channels. One embodiment of the reflection mixing module 1102 consists of a matrix 1202 and two gains 1204 and 1206, as depicted in FIG. 12. The mixing matrix 1202 may be made of unit vectors orthogonal to each other, avoiding power amplification or attenuation and decorrelating outputs, and the mixed reflections may be multiplied by Reflection Gain to achieve the desired Reflection Intensity.

Figure 13:
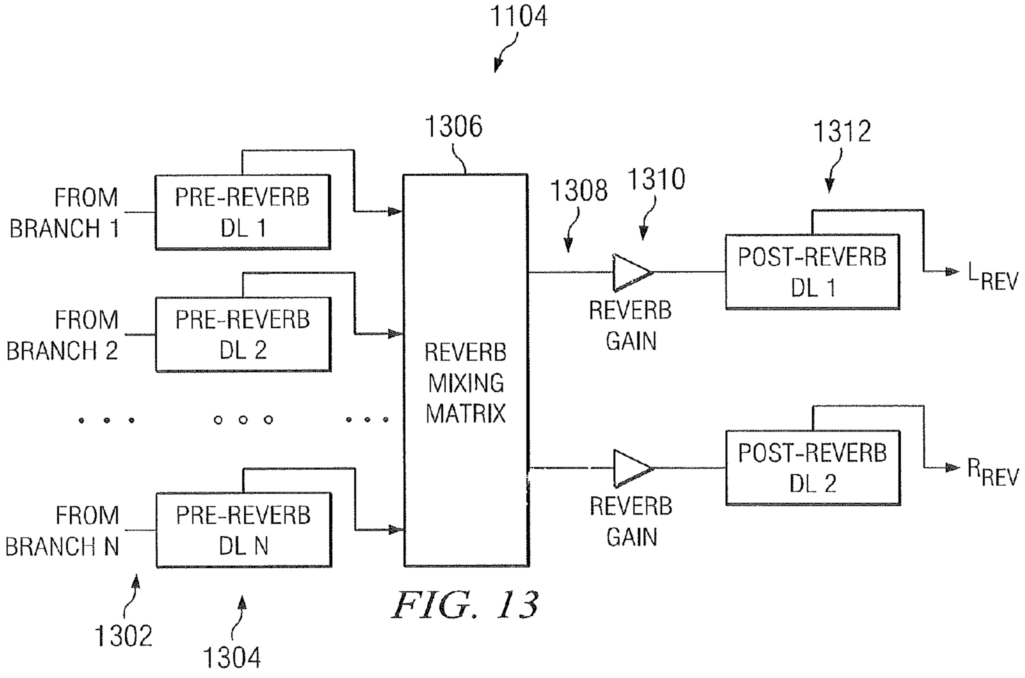
FIG. 13 is a schematic block diagram illustrating a reverb mixing module according to one embodiment of the present disclosure.

One embodiment of the reverb mixing module 1104 is depicted in FIG. 13. Inputs 1302 are first differently delayed by Pre-reverb DLs 1304 before entering a mixing matrix 1306. The distribution of these delay lengths (controlled by respective reading taps to Pre-reverb DLs) may be scaled proportionally to Reverb Delay, and the maximum delay length is preferably less than 30 milliseconds when Reverb Delay is at a maximum value. The reverb mixing matrix 1306 may be made up of unit vectors orthogonal to each other, and it controls the echo density, in addition to decorrelating the outputs. For high Diffusion Factor, its unit vectors may have more zeros to cut off more reverb paths; and vice versa. Mixed outputs 1308 of the matrix 1306 are multiplied by Reverb Gain to achieve a desired Reverb Intensity, and then may be further delayed by Post-reverb DLs 1312, whose reading taps may be determined by Reverb Delay.

The present disclosure proposes a method to generate and control artificial reverberations with low cost in terms of computation and memory. It produces a natural sounding reverberation that provides the sense of spaciousness of the desired environment, as specified by the descriptive parameters of a well established reverberation model. The density of the generated reverberation increases over time and the decay time is frequency-dependent. Other properties (intensity levels, delays, etc.) are well controlled as specified. The reverberation is generated with a rather simple and uniform structure, which generates early reflections and late reverbs in a unified manner as the real environment does without abrupt boundary between early and late reflections. The proposed method generates decorrelated outputs on two channels with one- or two-channel input.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A device comprising a reverberation controller stored in memory or other non-transitory tangible media, the reverberation controller configured to:

pre-process one or more predetermined characteristics of a first audio signal to produce a pre-processed signal;

generate a plurality of delayed outputs from the pre-processed signal, each output having a predetermined delay;

produce a plurality of reflection outputs from the plurality of delayed outputs by:

summing a plurality of outputs from a feedback matrix and the plurality of delayed outputs to produce a plurality of summed outputs, and filtering the summed outputs to yield filtered outputs, a portion of each filtered output including a reflection output and another portion of each filtered output including a feedback output;

pass at least some of the portions including the feedback outputs back through the feedback matrix;

pass at least some of the portions including the reflection outputs to a mixing module without passing back through the feedback matrix; and combine the plurality of reflection outputs to produce at least part of a second audio signal having a desired reverberation response.

2. The device of claim 1, wherein the controller is further configured to pre-process one or more predetermined characteristics of the first audio signal by:

controlling a gain of the first audio signal, and filtering high frequencies of the first audio signal.

3. The device of claim 2, wherein the gain of the first audio signal is controlled according to a desired power of the desired reverberation response, and high frequencies of the first audio signal are filtered according to a desired attenuation at a reference frequency relative to an attenuation at direct current (DC) of the desired reverberation response.

4. The device of claim 1, wherein the delays of the delayed outputs are determined according to a desired power of early reflections of the desired reverberation response.

5. The device of claim 1, wherein the outputs from the feedback matrix that are summed are not further delayed prior to being summed with the plurality of delayed outputs.

6. The device of claim 1, wherein the controller, in feeding the feedback outputs to the feedback matrix, is configured to:

filter the feedback outputs to produce filtered feedback outputs;

delay the filtered feedback outputs to produce delayed filtered feedback outputs; and control a gain of the delayed filtered feedback outputs to produce inputs to the feedback matrix.

7. The device of claim 6, wherein a decay characteristic of the reflection output is determined according to one or more of a desired delay time of an onset of late reverberation relative to a first reflection of the desired reverberation response and a desired reverberation decay time at low frequencies of the desired reverberation response, wherein a characteristic of the filtered reflection output is determined according to a desired ratio of decay time at high frequencies relative to decay time at low frequencies of the desired reverberation, response, wherein a delay of the delayed filtered reflection output is determined according to a desired modal density of late reverberations of the desired reverberation response, and wherein the gain of the delayed filtered reflection output is controlled according to the desired reverberation decay time at low frequencies of the desired reverberation response.

8. The device of claim 1, wherein the controller is further configured to combine the plurality of reflection outputs by:

combining at least a portion of the plurality of reflection outputs to produce a combined reflection output, combining at least another portion of the plurality of reflection outputs to produce a combined reverberation output, and summing the combined reflection output and the combined reverberation output to produce the second audio signal.

9. The device of claim 8, wherein the controller, in producing the combined reverberation output., is further configured to:

individually delay one or more of the plurality of reflection outputs to produce a delayed plurality of reflection outputs;

combine the delayed plurality of reflection outputs to produce a collective reverberation output;

control the gain of the collective reverberation output; and delay the gain-controlled collective reverberation output.

10. The device of claim 9, wherein a gain of the combined reflection output is controlled according to a desired power of early reflections of the desired reverberation response, wherein the one or more delays of the plurality of reflection outputs are determined according to a desired power of late reverberations of the desired reverberation response, wherein the gain of the collective reverberation output is controlled according to the desired power of late reverberations to produce a gain-controlled collective reverberation output, and wherein the gain-controlled collective reverberation output is delayed according to a desired delay time of an onset of late reverberation relative to a first reflection of the desired reverberation response to produce the combined reverberation output.

11. A method of adding a desired reverberation response to an audio signal, the method comprising;

pre-processing one or more predetermined characteristics of a first audio signal to produce a pre-processed signal;

generating a plurality of delayed outputs from the pre-processed signal, each output having a predetermined delay;

producing a plurality of reflection outputs from the plurality of delayed outputs by:

summing a plurality of outputs from a feedback matrix and the plurality of delayed outputs to produce a plurality of summed outputs, and filtering the summed outputs to yield filtered outputs, a portion of each filtered output including a reflection output and another portion of each filtered output including a feedback output;

passing at least some of the portions including the feedback outputs back through the feedback matrix;

passing at least some of the portions including the reflection outputs to a mixing module without passing back through the feedback matrix; and combining the plurality of reflection outputs to produce at least part of a second audio signal having a desired reverberation response.

12. The method of claim 11, wherein pre-processing one or more predetermined characteristics of the first audio signal further comprises:

controlling a gain of the first audio signal; and filtering high frequencies of the first audio signal.

13. The method of claim 12, wherein the gain of the first audio signal is controlled according to a desired power of the desired reverberation response and high frequencies of the first audio signal are filtered according to a desired attenuation of the reverberation response at a reference frequency relative to an attenuation at direct current (DC) of the desired reverberation response.

14. The method of claim 11, wherein the delays of the delayed outputs are determined according to a desired power of early reflections of the desired reverberation response.

15. The method of claim 11, wherein outputs from the feedback matrix that are summed are not further delayed prior to being summed with the plurality of delayed outputs.

16. The method of claim 15, wherein feeding the feedback outputs to the feedback matrix comprises:

filtering the feedback outputs to produce filtered feedback outputs;

delaying the filtered feedback outputs to produce delayed filtered feedback outputs; and controlling a gain of the delayed filtered feedback outputs to produce inputs to the feedback matrix.

17. The method of claim 16, wherein a decay characteristic of the reflection output is determined according to one or more of a desired delay time of an onset of late reverberation relative to a first reflection of the desired reverberation response and a desired reverberation decay time at low frequencies of the desired reverberation response, wherein a characteristic of the filtered reflection output is determined according to a desired ratio or decay time at high frequencies relative to decay time at low frequencies of the desired reverberation response, wherein a delay of the delayed filtered reflection output is determined according to a desired modal density of late reverberations of the desired reverberation response, and wherein the gain of the delayed filtered reflection output is controlled according to the desired reverberation decay time at low frequencies of the desired reverberation response.

18. The method of claim 11, wherein combining the plurality of reflection outputs to produce a second audio signal further comprises:

combining at least a portion of the plurality of reflection outputs to produce a combined reflection output;

combining at least another portion of the plurality of reflection outputs to produce a combined reverberation output; and summing the combined reflection output and the combined reverberation output to produce the second audio signal.

19. The method of claim 18, wherein producing the combined reverberation output further comprises:

individually delaying one or more of the plurality of reflection outputs to produce a delayed plurality of reflection outputs;

combining the delayed plurality of reflection outputs to produce a collective reverberation output;

controlling the gain of the collective reverberation output; and delaying the gain-controlled collective reverberation output.

20. The method of claim 19, wherein a gain of the combined reflection output is controlled according to a desired power of early reflections, and wherein the one or more delays of the plurality of reflection outputs are determined according to a desired power of late reverberations of the desired reverberation response, wherein the gain of the collective reverberation output is controlled according to the desired power of late reverberations to produce a gain-controlled collective reverberation output, and wherein the gain-controlled collective reverberation output is delayed according to a desired delay time of an onset of late reverberation relative to a first reflection of the desired reverberation response to produce the combined reverberation output.

21. A system, comprising:

an audio source;

an audio output;

a control unit configured to receive information from a user, the information relating to a desired reverberation response; and a reverberation generator coupled to the audio source, the audio output, and the controlling unit, the reverberation generator comprising a reverberation controller configured to:

pre-process one or more selected characteristics of a first audio signal from the audio source to produce a pre-processed signal;

generate a plurality of delayed outputs from the pre-processed signal, each output having a predetermined delay; produce a plurality of reflection outputs from the plurality of delayed outputs by:

summing a plurality of outputs from a feedback matrix and the plurality of delayed outputs to produce a plurality of summed outputs, and filtering the summed outputs to yield filtered outputs, a portion of each filtered output including a reflection output and another portion of each filtered output including a feedback output;

pass the portions including the feedback outputs back through the feedback matrix;

pass the portions including the reflection outputs to a mixing module without passing back through the feedback matrix; and combine the plurality of reflection outputs to produce at least part of a second audio signal to the audio output, the second audio signal having the desired reverberation response.

22. The system of claim 21, wherein the controller is further configured to:

pre-process one or more selected characteristics of a first audio signal from the audio source to produce a pre-processed signal by:

controlling a gain of the first audio signal; and filtering high frequencies of the first audio signal; and feed the feedback outputs to the feedback matrix by:

filtering the feedback outputs to produce filtered feedback outputs;

delaying the filtered feedback outputs to produce delayed filtered feedback outputs; and controlling a gain of the delayed filtered feedback outputs to produce inputs to the feedback matrix; and combine the plurality of reflection outputs to produce a second audio signal to the audio output by:

combining at least a portion of the plurality of reflection outputs to produce a combined reflection output, combining at least another portion of the plurality of reflection outputs to produce a combined reverberation output, and summing the combined reflection output and the combined reverberation output to produce the second audio signal.

23. The system of claim 22, wherein the gain of the first audio signal, is controlled according to a desired power of the desired reverberation response, and high frequencies of the first audio signal are filtered according to a desired attenuation at a reference frequency relative to an attenuation at direct current (DC) of the desired reverberation response, wherein the delays of the delayed outputs are determined according to a desired power of early reflections of the desired reverberation response, wherein a decay characteristic of the reflection output is determined according to one or more of a desired delay time of an onset of late reverberation relative to a first reflection of the desired reverberation response and a desired reverberation decay time at low frequencies of the desired reverberation response, wherein a characteristic of the filtered reflection output is determined according to a desired ratio of decay time at high frequencies relative to decay time at low frequencies of the desired reverberation response, wherein a delay of the delayed filtered reflection output is determined according to a desired modal density of late reverberations of the desired reverberation response, wherein the gain of the delayed filtered reflection output is controlled according to the desired reverberation decay time at low frequencies of the desired reverberation response, and wherein a gain of the combined reflection output is controlled according to a desired power of early reflections of the desired reverberation response.

* * * * *